US006275109B1

United States Patent
Tang

(10) Patent No.: US 6,275,109 B1
(45) Date of Patent: Aug. 14, 2001

(54) LOW NOISE MICROPHONE PREAMPLIFIER

(75) Inventor: Zhi-Long Tang, Allentown, PA (US)

(73) Assignee: Agere Systems Guardian Corp.

( * ) Notice: Subject to any disclaimer, the term of this patent is extended or adjusted under 35 U.S.C. 154(b) by 0 days.

(21) Appl. No.: 09/366,117

(22) Filed: Aug. 2, 1999

(51) Int. Cl.$^7$ .................... H03F 3/45; H03F 3/14
(52) U.S. Cl. .................. 330/261; 330/253; 330/307
(58) Field of Search .................... 330/252, 253, 330/261, 307

(56) References Cited

U.S. PATENT DOCUMENTS

| | | | |
|---|---|---|---|
| 3,938,054 | * | 2/1976 | Leidich ................... 330/261 |
| 3,947,778 | * | 3/1976 | Hsiao et al. ............. 330/261 |
| 4,271,394 | * | 6/1981 | Leidich ................... 330/253 |

OTHER PUBLICATIONS

IEEE Journal of Solid–State Circuits, vol. 33, No. 8, Aug. 1998, "A High–Performance Analog Front–End 14–Bit Codec for 2.7–V Digital Cellular Phones", pp. 1158–1166.

Paul R. Gray, Robert G. Meyer, Analysis and Design of Analog Integrated Circuits, Second Edition, John Wiley & Sons, New York, Chichester, Brisbane, Toronto, Singapore, pp. 388–391, 394–395, & 708.

* cited by examiner

*Primary Examiner*—Robert Pascal
*Assistant Examiner*—Patricia T. Nguyen
(74) *Attorney, Agent, or Firm*—Duane, Morris & Heckscher LLP

(57) ABSTRACT

An integrated circuit preamplifier amplifies an input signal comprising first and second differential input signals to provide an amplified output signal comprising first and second differential output signals. A biasing circuit of the preamplifier provides a bias current. An open-loop differential amplifier of the preamplifier is coupled to the biasing circuit. The differential amplifier includes a differential amplifier pair having first and second differential amplifying transistors, which are coupled at respective gate terminals to the first and second differential input signals. Each of the amplifying transistors are coupled in open-loop configuration at a drain terminal to a respective load resistor coupled to ground, and the source terminals of the amplifying transistors are coupled together to receive the bias current. The first and second differential output signals are formed across the respective first and second load resistors.

6 Claims, 1 Drawing Sheet

LOW NOISE MICROPHONE PREAMPLIFIER

BACKGROUND OF THE INVENTION

1. Field of the Invention

The present invention relates to amplifiers and, in particular, to microphone preamplifiers used to preamplify signals received from microphones.

2. Description of the Related Art

The use of amplifiers is ubiquitous today. One type of amplifier, known as a "preamplifier," is often used to amplify ("preamplify") a raw, weak signal received from some source, such as a transducer. In one usage, the comparatively small voltage input signal is provided by a microphone to an amplifier referred to as a microphone preamplifier. The microphone preamplifier amplifies the input analog audio signal to provide a larger-amplitude "preamplified" output signal having the same waveform as that of the input signal, within a certain degree of accuracy. The preamplifier typically provides a preamplified signal which is within a standardized dynamic range.

The preamplified signal is then passed on to some further stage. For example, the preamplified signal may be processed by fuer components, such as automatic gain control (AGC) or other components or stages. The preamplified signal may be further amplified by an amplifier, to drive an output device such as a loudspeaker, for example. Other uses may also be made of the preamplified signal. For example, the preamplified signal may be further processed or amplified and digitized and/or recorded on some storage medium in digital or analog form. If converted to digital form, the digital audio signal may be processed by a digital signal processor (DSP) before being stored or played on a speaker.

Because the voltage signal input into preamplifiers is weak, it is important for microphone preamplifiers, as well as other amplifiers amplifying weak input signals, to have a very good noise performance. Otherwise, the noise, which may be significant in comparison to the small input signal, may dominate. Noise arises in a variety of ways. For example, in amplifiers (including preamplifiers) implemented as part of an integrated circuit (IC) having a substrate, noise can arise from comparatively noisy sections of the substrate and thus adversely affect the amplifier portions of the IC. Pass-transistor switches turning off in switched-capacitor applications may also produce noise. Noise may be generated when unavoidable parasitics, associated with all silicon ICs, provide numerous paths for unwanted disturbances to couple into the signal path of an analog circuit via the substrate, the power supply rails, the ground lines, and/or even directly from nonideal components. Noise may accompany the input signal if the input lines delivering the input signal from the transducer pick up noise from some source external to the IC. Such noise may come, for example, from a noisy power supply that powers a transducer such as a microphone. Feedback resistors may also introduce thermal noise into the input signal path. the input stage of the amplifier itself may also introduce thermal noise and so-called "flick" noise.

Noise may thus be introduced into the signal path of an amplifier (or preamplifier), and be amplified along with the input signal, thus causing the amplified (preamplified) output signal to be a distorted representation of the input waveform. Such disturbances and distortions can accumulate, potentially leading to serious loss in signal-to-noise ratio and dynamic range.

Various types of amplifiers are in use. ICs typically implement amplifiers which utilize one or more operational amplifiers ("op amps"). A conventional single-ended op amp, which has differential input and singled-ended output, may be especially prone to being adversely affected by such noise. Such an op amp has positive and negative differential inputs, and a single output terminal that provides an output voltage with respect to ground.

More complicated amplifier configurations, such as differential output op amp circuits or balanced differential output op amp circuits, are often utilized because of their superior noise resistance characteristics. For example, a differential op amp maintains positive and negative signal paths and provides two differential output terminals rather than having a single-ended output. The output voltage is the difference between the two differential output terminals rather than an absolute value with respect to ground. This can help reduce the impact of noise, such as that produced by parasitic couplings or other sources. For example, if such noise is injected into one signal path it is likely that the same or similar noise will be injected into the other signal path. Thus, since the output signal is seen as the difference between the two output terminals, the effect of the noise will be canceled out and will not be present in the output signal itself.

Further improvement is possible if such an analog op amp circuit is not only differential, but also balanced. A balanced differential op amp circuit is realized with dual inverting and noninverting signal paths, in a completely symmetrical layout, such that all parasitic injections couple equally into both signal paths as common-mode signals. The differential nature of these circuits causes these common-mode disturbances to cancel (or nearly cancel) such that their impact is reduced significantly. Single-ended, differential output, and balanced differential output op amp circuits are described in further detail in David A. Johns & Ken Martin, *Analog Integrated Circuit Design* (New York: John Wiley & Sons, Inc., 1997): pp. 280–282, and Kenneth R. Laker & Willy M.C. Sansen, *Design of Analog Integrated Circuits and Systems* (New York: McGraw-Hill, Inc., 1994): pp. 456–462.

Referring now to FIG. 1, there is shown a circuit diagram of a conventional closed-loop microphone preamplifier 100, which is similar to that described in FIG. 6 of G. Nicollini et al., "A High-Performance Analog Front-End 14-Bit Codec for 2.7-V Digital Cellular Phones," *IEEE Journal of Solid State Circuits*, vol. 33, no. 8, August 1998, pp. 1158–1166. Microphone preamplifier 100 is a balanced differential op amp-based preamplifier, which comprises two symmetrical, balanced differential op amp circuits, each coupled to an identical feedback resistor $R_f$ and input resistor $R_i$ in a closed-loop configuration. Both input resistors $R_j$ are coupled at one terminal to common-mode voltage $V_{cm}$, and at the other terminal to the negative input of their respective op amp and through feedback resistor $R_f$ to the output terminal of the respective op amp.

Common-mode voltage $V_{CM}$ is provided by a common-mode feedback (CMFB) circuit (not shown). CMFB circuits are described in further detail in the David A. Johns & Ken Martin text, at pp. 280–282. The CMFB circuitry is used to establish the common-mode (i.e., average) output voltage. Ideally, it keeps this common-mode voltage immovable, preferably close to halfway between the power-supply voltages ($V_{DD}$) which power each op amp, even when large differential signals are present. Without it, the common-mode voltage is left to drift, since, although the op amps are placed in a feedback configuration, the common-mode loop gain is not typically large enough to control its value. Such is not the case with differential signals as the differential loop gain is typically quite large.

An input voltage signal $V_I$ is received in the form of differential input signals $V_{IP}$, and $V_{IN}$ (where the letters P and N denote "positive" and "negative", where the "negative" signal $V_{IN}$ subtracted from the "positive" signal $V_{IP}$ represents the input signal $V_1$). These differential input signals are applied to the positive input terminals of the two op amps, respectively. The differential input signals $V_{IP}$ and $V_{IN}$ may be considered to be generated from the components modeling the microphone transducer, namely an external voltage source $V_1$, and its associated resistance $R_1$ and capacitance $C_1$. The preamplified output signal $V_O$ is the difference between differential outputs $V_{OP}$ and $V_{ON}$.

In preamplifier 100, the gain A of each differential op amp circuit is $R_f/R_i$. The output voltage $V_O = V_{OP} - V_{ON} = AV_I = A(V_{IP} - V_{IN})$, where $A = R_f/R_i$. For a given gain A, the $R_f/R_i$ ratio cannot be varied. However, different values of $R_f$ and $R_i$ may be selected to provide the same $R_f/R_i$ ratio. In order to minimize noise, it is desirable to make the values of $R_f$ and $R_i$ as small as possible, because less noise is introduced for smaller resistances and for the higher feedback currents accompanying the use of smaller resistances. The values of $R_f$ and $R_i$ may be decreased so long as the desired ratio $R_f/R_i$ is maintained to achieve gain A.

However, resistors $R_f$ and $R_i$ cannot be made arbitrarily small, because they pose loading constraints to the op amps. The smaller values for $R_f$ and $R_i$ selected, the larger current must be handled by the op amps. Thus, there is a limit to how small gain-setting resistors $R_f$, $R_i$ can be, because smaller resistors introduce more load on the op amps. Accordingly, it may be impractical or impossible to reduce the noise introduced by the gain-setting resistors (primarily $R_i$) low enough for low-noise applications such as microphone preamplifiers. Thus, when using closed-loop microphone preamplifiers, the noise introduced in the preamplifier may become dominant.

SUMMARY

An integrated circuit preamplifier amplifies an input signal comprising first and second differential input signals to provide an amplified output signal comprising first and second differential output signals. A biasing circuit of the preamplifier provides a bias current. An open-loop differential amplifier of the preamplifier is coupled to the biasing circuit. The differential amplifier includes a differential amplifier pair having first and second differential amplifying transistors, which are coupled at respective gate terminals to the first and second differential input signals. Each of the amplifying transistors are coupled in open-loop configuration at a drain terminal to a respective load resistor coupled to ground, and the source terminals of the amplifying transistors are coupled together at a bias junction to receive the bias current. The first and second differential output signals are formed across the respective first and second load resistors.

DESCRIPTION OF THE PREFERRED EMBODIMENT

Figure 1:
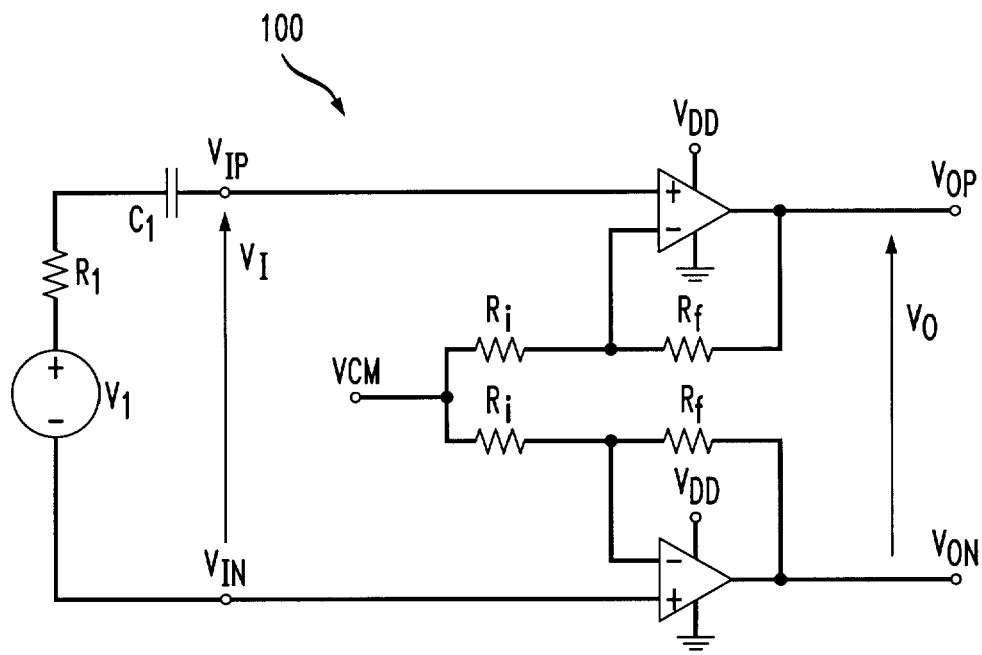
FIG. 1 is a circuit diagram of a closed-loop microphone preamplifier.
Figure 2:
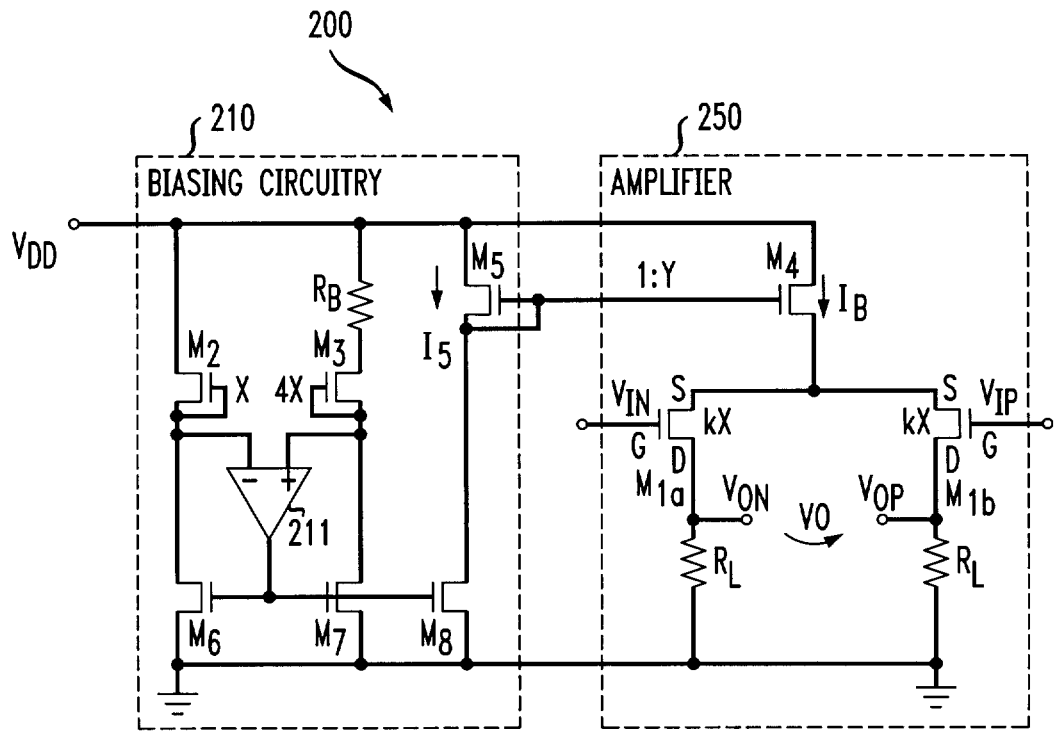
FIG. 2 is a circuit diagram of a low-noise open-loop microphone preamplifier, in accordance with an embodiment of the present invention.

Referring now to FIG. 2, there is illustrated a circuit diagram of a low-noise open-loop microphone preamplifier 200, in accordance with an embodiment of the present invention. Preamplifier 200 comprises biasing circuitry or section 210, and amplifier section 250. Preamplifier 200 is powered by the same power supply voltage $V_{DD}$ as closed-loop preamplifier 100, and provides the same input terminals $V_{IN}$, $V_{IP}$ and output terminals $V_{ON}$, $V_{OP}$ as closed-loop preamplifier 100. However, as described below, preamplifier 200 uses a differential pair ($M_{IA}$, $M_{IB}$), each having an open-loop resistive load ($R_L$), as a differential amplifier in an open-loop configuration, and the input noise contribution can be made arbitrarily small.

One reason a closed-loop configuration is utilized (e.g. in closed-loop preamplifier 100) in some preamplifier applications is to avoid the gain variations which can occur in open-loop amplifier designs. However, the attendant noise limitations described previously result with closed-loop designs. In preamplifier 200, an open-loop configuration is utilized, in which the input noise can be made arbitrarily small. Biasing section 210 provides a bias current $I_B$, which, along with other aspects of the design of preamplifier 200, described below, help to overcome gain variations that normally plague open-loop configured amplifiers.

Biasing section 210 comprises metal-oxide semiconductor field-effect transistors (MOSFETs) $M_2$ and $M_3$, op amp 211, bias resistor $R_B$ current mirror transistor $M_5$, and three further transistors $M_6$, $M_7$, and $M_8$. As denoted by the labels "X" and "4X", transistor $M_3$ is four times larger than transistor $M_2$.

Biasing section 210 provides a preliminary bias current $I_5$ through transistor $M_5$, which is one part of a current mirror. Amplifier section 250 transistor $M_4$ of the current mirror provides the actual bias current $I_B$ at the bias node which is the junction of the source terminals of the two amplifying transistors. The bias current $I_B$ is applied to the differential pair to drive the differential amplifying transistors $M_{1A}$, $M_{1B}$.

Amplifier section 250 comprises two identical load resistors $R_L$, two identical amplifier transistors $M_{1A}$, $M_{1B}$ (collectively, transistor $M_1$), and current mirror transistor $M_4$, which provides bias current $I_B$, in conjunction with current mirror transistor $M_5$ of biasing section 210, as described above. When the differential input signals differential input signals $V_{IP}$ and $V_{IN}$ are the same, transistors $M_{1A}$, $M_{1B}$ conduct the same portion (i.e. 50%) of bias current $I_B$ and thus develop the same voltages $V_{ON}$, $V_{OP}$ across identical load resistors $R_L$, so that $V_O=0$ because $V_{ON}=V_{OP}$. As $V_{IP}$ and $V_{IN}$ differ about a common mode, transistors $M_{1A}$, $M_{1B}$ conduct different portions of bias current $I_B$ and thus develop differential output voltages $V_{ON}$, $V_{OP}$ across load resistors $R_L$. Bias current $I_B$ is fixed at Y times the preliminary bias current $I_5$, which is itself based on the value of bias resistor $R_B$. Thus, if load resistors $R_L$ change in value due to process variations, the gain of amplifier 250 would vary if fixed bias current $I_B$ stayed the same. However, process variations that affect load resistors $R_L$ affect bias resistor $R_B$ similarly, so that bias current $I_B$ varies in the same manner as do the load resistors $R_L$.

In the illustrated embodiment, the gain A of preamplifier 200 depends only on device ratios. The ratios between various components is set as illustrated, and may be varied to provide different gain or noise characteristics. In particular, the gain A of the amplifier (where $V_O=AV_1$) is:

$$A = (KY/2)^{1/2} * (R_L/R_B)$$

where K is the device size ratio between transistors $M_1$ and $M_2$, Y is the current mirror ratio, and $R_L/R_B$ is a resistor ratio.

Because the gain A depends only on device ratios, if the same process is utilized to fabricate the entire preamplifier 200 circuitry, process variations will not introduce significant gain variations. In one embodiment, therefore, the entire preamplifier 200 is manufactured as an IC, so that all components of preamplifier 200 are made with the same process. This means that any process variations in the values and sizes of components are likely to affect all components in the same manner. Thus, even if the size of transistors $M_2$, $M_3$ vary from the ideal due to process variations, transistor $M_3$ is still four times larger than transistor $M_2$. The ratio between resistors, e.g. $R_L/R_B$, is thus process independent, as are other ratios such as K and Y. Thus, the gain A is process independent, because it depends only on component ratios which do not vary for a given layout even if there are process variations.

For example, the current mirror comprising transistors $M_5$ and $M_4$ causes bias current $I_B$ to be equal to $Y*I_5$, because of the 1:Y size ratio of current mirror transistors $M_5$, $M_4$. Because bias resistor $R_B$ and load resistors $R_L$ are made with the same process, their relative sizes are fixed even if there is some process variation in manufacturing preamplifier circuit 200. Thus, bias current $I_B$ may be used to overcome gain variations introduced by any variations in the value of load resistors $R_L$, because its value will be a fixed value which is appropriate for whatever the actual values of load resistors $R_L$ are, because the process-induced variance of these values is tracked by a similar variance in bias current $I_B$, since this current's value depends on bias resistor $R_B$'s value. The size of transistors $M_{1A}$, $M_{1B}$ are also relative to the biasing section 210 transistor $M_2$, $M_3$. In particular, transistors $M_{1A}$, $M_{1B}$ are of size KX, i.e. K times the size of transistor $M_2$, which has a size X.

Any noise N introduced by bias current $I_B$ is not introduced into the output signal $V_O$ because it is applied equally to differential signals $V_{ON}$, $V_{OP}$, and is thus canceled out. Thus, if $V_{OP}$, $V_{ON}$ acquire noise N from bias current $I_B$, so that the output terminals provide ($V_{OP}$+N) and ($V_{ON}$+N), respectively, then:

$$V_O = (V_{OP} + N) - (V_{ON} + N)$$
$$= V_{OP} - V_{ON} + (N - N)$$
$$= V_{OP} - V_{ON} - 0$$
$$= V_{OP} - V_{ON}$$

Therefore, as will be appreciated, in the open-loop configuration of amplifier stage 250, the only input noise contributors are transistors $M_{1A}$, $M_{1B}$. Any noise from bias current $I^B$ is canceled out by the use of open-loop configuration differential pair $M_{1A}$, $M_{1B}$; but gain variations are minimized because the gain depends only on process-independent component ratios. The remaining noise, from transistors $M_{1A}$, $M_{1B}$, may be made arbitrarily small by adjusting the size of transistors $M_{1A}$, $M_{1B}$, and the magnitude of the bias current $I_B$. In particular, the larger are amplifier transistors $M_1$, the smaller is the noise introduced thereby. Larger amplifier transistors $M_{1A}$, $M_{1B}$ require a larger bias current $I_B$. Thus, to reduce noise, the size (KX) of transistors $M_{1A}$, $M_{1B}$ is increased. Other device sizes are also adjusted to provide the appropriate device ratios, bias current, and process-independent gain A.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. An integrated circuit comprising a preamplifier for amplifying an input signal comprising first and second non-amplified differential input signals to provide an amplified output signal comprising first and second differential output signals, the preamplifier comprising:

(a) a biasing circuit for providing a bias current, said biasing circuit comprising:

a bias resistor and first current mirror transistor for producing a preliminary bias current which is proportional to the value of the bias resistor; and a second current mirror transistor coupled to the first current mirror transistor to form a current mirror which generates with the second current mirror transistor the bias current, wherein the bias current is proportional to the preliminary biasing current; and (b) an open-loop differential amplifier, coupled to the biasing circuit, comprising a differential amplifier pair comprising first and second differential amplifying transistors coupled at respective gate terminals to the first and second differential input signals, wherein the first and second amplifying transistors are coupled in open-loop configuration at respective drain terminals to first and second load resistors coupled to ground, respectively, wherein respective source terminals of the amplifying transistors are coupled together to receive the bias current, wherein the first and second differential output signals are formed across the first and second load resistors, respectively, wherein the preamplifier has a gain that depends at least in part on the ratio between the resistance value of the first and second load resistors and the resistance value of the bias resistor.

2. The integrated circuit of claim 1, wherein the preamplifier has a gain which depends only on component ratios for components of the preamplifier, wherein the component ratios are not affected by variations in a fabrication process used to fabricate the integrated circuit.

3. The integrated circuit of claim 2, wherein noise in the bias current is canceled out in the differential amplifier pair.

4. The integrated circuit of claim 3, wherein noise introduced into the output signal by the differential amplifying transistors may be made arbitrarily small by increasing the size of the differential amplifying transistors.

5. The integrated circuit of claim 1, wherein the biasing circuit and the differential amplifier are fabricated via the same fabrication process used to fabricate the integrated circuit.

6. The integrated circuit of claim 1, wherein the first and second differential input signals are received from a microphone transducer.

* * * * *